United States Patent
Hiyoshi et al.

(10) Patent No.: US 9,012,922 B2
(45) Date of Patent: *Apr. 21, 2015

(54) SILICON CARBIDE SEMICONDUCTOR DEVICE AND METHOD FOR MANUFACTURING SAME

(75) Inventors: Toru Hiyoshi, Osaka (JP); Takeyoshi Masuda, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 11 days.

This patent is subject to a terminal disclaimer.

(21) Appl. No.: 13/607,388

(22) Filed: Sep. 7, 2012

(65) Prior Publication Data

US 2013/0062629 A1 Mar. 14, 2013

Related U.S. Application Data

(60) Provisional application No. 61/534,714, filed on Sep. 14, 2011.

(30) Foreign Application Priority Data

Sep. 14, 2011 (JP) .................................. 2011-200247

(51) Int. Cl.
*H01L 29/15* (2006.01)
*H01L 31/0312* (2006.01)
(Continued)

(52) U.S. Cl.
CPC ........ *H01L 21/3065* (2013.01); *H01L 21/3081* (2013.01); *H01L 29/1608* (2013.01);
(Continued)

(58) Field of Classification Search
USPC ............. 257/77, E21.054, E21.065, E21.182, 257/E29.104, E31.049; 438/46, 285, 779, 438/931
See application file for complete search history.

(56) References Cited

U.S. PATENT DOCUMENTS 5,744,826 A 4/1998 Takeuchi et al.
5,976,936 A * 11/1999 Miyajima et al. ............. 438/268
(Continued)

FOREIGN PATENT DOCUMENTS

CN 101542739 A 9/2009
EP 1612851 A1 1/2006
(Continued)

OTHER PUBLICATIONS

Yano et al., "SiO2/SiC Interface Properties on Various Surface orientations" Mat. Res. Soc. Symp. Proc, vol. 742, 2003, pp. 219-226.*
(Continued)

*Primary Examiner* — Asok K Sarkar
(74) *Attorney, Agent, or Firm* — Venable LLP; Michael A. Sartori; F. Brock Riggs

(57) ABSTRACT

A substrate is provided with a main surface having an off angle of 5° or smaller relative to a reference plane. The reference plane is a {000-1} plane in the case of hexagonal system and is a {111} plane in the case of cubic system. A silicon carbide layer is epitaxially formed on the main surface of the substrate. The silicon carbide layer is provided with a trench having first and second side walls opposite to each other. Each of the first and second side walls includes a channel region. Further, each of the first and second side walls substantially includes one of a {0-33-8} plane and a {01-1-4} plane in the case of the hexagonal system and substantially includes a {100} plane in the case of the cubic system.

10 Claims, 10 Drawing Sheets

(51) Int. Cl.
  *H01L 21/3065* (2006.01)
  *H01L 21/308* (2006.01)
  *H01L 29/16* (2006.01)
  *H01L 29/423* (2006.01)
  *H01L 29/66* (2006.01)
  *H01L 29/739* (2006.01)
  *H01L 29/78* (2006.01)
  *H01L 29/04* (2006.01)
  *H01L 29/08* (2006.01)
  *H01L 21/04* (2006.01)
  *H01L 21/02* (2006.01)
  *H01L 29/06* (2006.01)

(52) U.S. Cl.
  CPC ...... *H01L29/4236* (2013.01); *H01L 29/66068* (2013.01); *H01L 29/66348* (2013.01); *H01L 29/7397* (2013.01); *H01L 29/7813* (2013.01); *H01L 29/045* (2013.01); *H01L 29/0834* (2013.01); *H01L 29/0839* (2013.01); *H01L 21/0475* (2013.01); *H01L 21/02378* (2013.01); *H01L 21/02433* (2013.01); *H01L 21/02529* (2013.01); *H01L 21/02587* (2013.01); *H01L 21/0262* (2013.01); *H01L 29/4238* (2013.01); *H01L 29/0623* (2013.01); *H01L 29/0696* (2013.01); *Y10S 438/931* (2013.01)

(56) References Cited

U.S. PATENT DOCUMENTS

| | | | |
|---|---|---|---|
| 6,020,600 | A | 2/2000 | Miyajima et al. |
| 6,133,587 | A | 10/2000 | Takeuchi et al. |
| 6,452,228 | B1 | 9/2002 | Okuno et al. |
| 6,734,461 | B1 | 5/2004 | Shiomi et al. |
| 2003/0012925 | A1 | 1/2003 | Gorrell |
| 2003/0075765 | A1 | 4/2003 | Ohnakado et al. |
| 2003/0137012 | A1 | 7/2003 | Yamaguchi et al. |
| 2003/0227061 | A1 | 12/2003 | Yokogawa et al. |
| 2006/0214268 | A1 | 9/2006 | Maeyama et al. |
| 2006/0249073 | A1 | 11/2006 | Asaoka et al. |
| 2007/0026632 | A1 | 2/2007 | Yamamoto |
| 2007/0057262 | A1 | 3/2007 | Nakamura et al. |
| 2007/0090370 | A1 | 4/2007 | Nakayama et al. |
| 2007/0200116 | A1* | 8/2007 | Harris et al. ............... 257/77 |
| 2007/0210316 | A1 | 9/2007 | Yonezawa et al. |
| 2007/0267663 | A1 | 11/2007 | Harada |
| 2008/0032880 | A1 | 2/2008 | Maruyama et al. |
| 2008/0213536 | A1 | 9/2008 | Maruyama et al. |
| 2008/0230787 | A1 | 9/2008 | Suzuki et al. |
| 2009/0114982 | A1 | 5/2009 | Saka et al. |
| 2009/0200559 | A1 | 8/2009 | Suzuki et al. |
| 2010/0062582 | A1 | 3/2010 | Fujikawa |
| 2010/0261333 | A1* | 10/2010 | Nakayama et al. ........... 438/460 |
| 2010/0314626 | A1 | 12/2010 | Harada et al. |
| 2011/0121316 | A1 | 5/2011 | Harada |
| 2011/0175110 | A1 | 7/2011 | Wada et al. |
| 2011/0201187 | A1 | 8/2011 | Nishiwaki et al. |
| 2011/0233560 | A1 | 9/2011 | Koike et al. |
| 2012/0161154 | A1 | 6/2012 | Mimura et al. |
| 2012/0205670 | A1 | 8/2012 | Kudou et al. |
| 2012/0228640 | A1 | 9/2012 | Masuda et al. |
| 2012/0248461 | A1 | 10/2012 | Masuda et al. |
| 2012/0309195 | A1 | 12/2012 | Masuda |
| 2014/0203300 | A1 | 7/2014 | Hatayama et al. |

FOREIGN PATENT DOCUMENTS

| | | | |
|---|---|---|---|
| JP | 07-326755 | | 12/1995 |
| JP | 08-070124 | A | 3/1996 |
| JP | 09-74191 | A | 3/1997 |
| JP | 9-199724 | A | 7/1997 |
| JP | 2000-021849 | A | 1/2000 |
| JP | 2001-002499 | A | 1/2001 |
| JP | 2001-503726 | A | 3/2001 |
| JP | 2004-292305 | A | 10/2004 |
| JP | 2005-056868 | | 3/2005 |
| JP | 2005-223255 | A | 8/2005 |
| JP | 2005-294872 | A | 10/2005 |
| JP | 2005-328013 | A | 11/2005 |
| JP | 2005-340685 | | 12/2005 |
| JP | 2006-016288 | A | 1/2006 |
| JP | 2006-228901 | A | 8/2006 |
| JP | 2006-303469 | A | 11/2006 |
| JP | 2007-035823 | A | 2/2007 |
| JP | 2007-053227 | A | 3/2007 |
| JP | 2007-080971 | A | 3/2007 |
| JP | 2007-165657 | A | 6/2007 |
| JP | 2007-182330 | A | 7/2007 |
| JP | 2007-311627 | A | 11/2007 |
| JP | 2008-135534 | A | 6/2008 |
| JP | 2008-135653 | A | 6/2008 |
| JP | 2008-235546 | | 10/2008 |
| JP | 2009-5233 | A | 6/2009 |
| JP | 2009-170456 | A | 7/2009 |
| JP | 2009-289987 | A | 12/2009 |
| JP | 2010-040564 | A | 2/2010 |
| JP | 2010-062381 | A | 3/2010 |
| JP | 2010-103326 | A | 5/2010 |
| JP | 2010-147222 | A | 7/2010 |
| JP | 2011-044513 | A | 3/2011 |
| WO | WO-98/21386 | A1 | 5/1998 |
| WO | WO-02/097852 | A2 | 12/2002 |
| WO | WO-2005/116307 | A1 | 12/2005 |
| WO | WO-2007/081964 | A2 | 7/2007 |
| WO | WO-2011/048800 | A1 | 4/2011 |
| WO | WO-2012/017796 | A1 | 2/2012 |
| WO | WO-2013/031172 | A1 | 7/2013 |

OTHER PUBLICATIONS

International Search Report and Written Opinion in PCT International Application No. PCT/JP2012/070658, dated Nov. 27, 2012.
Hiroshi Yano et al., "SiO$_2$/SiC Interface Properties on Various Surface Orientations," Mat. Res. Soc. Symp. Proc., vol. 742, 2003 Materials Research Society, pp. 219-226.
Office Action issued in U.S. Appl. No. 13/805,279 dated Mar. 24, 2014.
International Search Report and Written Opinion issued in PCT Patent Application No. PCT/JP2011/066096 dated Oct. 25, 2011.
Office Action issued in U.S. Appl. No. 13/579,815 dated Jun. 24, 2013.
Office Action issued in U.S. Appl. No. 13/579,815 dated Nov. 1, 2013.
Notice of Grounds of Rejection issued in Japanese Patent Application No. 2012-527720 dated Aug. 19, 2014.
International Search Report and Written Opinion issued in PCT Patent Application No. PCT/JP2011/067501 dated Nov. 8, 2011.
Office Action issued in U.S. Appl. No. 13/613,785 dated Dec. 6, 2013.
International Search Report and Written Opinion issued in PCT Patent Application No. PCT/JP2012/070681 dated Nov. 20, 2012.
"Epitaxial Devices—Characteristics—Electronic Circuits and Diagram—Electronics Projects and Design," Jun. 11, 2010, accessed from the Internet on Aug. 26, 2013 from: http://www.circuitstoday.com/epitaxial-devices-characteristics.
"A Primer on Photodiode Technology," accessed from the Internet: http://home.sandiego.edu/~ekim/photodiode/pdtech.html.
"pn junction equilibrium graph," Wikipedia, 1 page.
Office Action issued in U.S. Appl. No. 13/613,838 dated Sep. 16, 2013.
Office Action issued in U.S. Appl. No. 13/613,838 dated Mar. 3, 2014.
International Search Report and Written Opinion issued in PCT Patent Application No. PCT/JP2012/069790 dated Sep. 18, 2012.
Office Action issued in U.S. Appl. No. 13/658,583 dated Mar. 29, 2013.
International Search Report and Written Opinion issued in PCT Patent Application No. PCT/JP2012/075516 dated Nov. 27, 2012.

(56) References Cited

OTHER PUBLICATIONS

Office Action issued in U.S. Appl. No. 13/613,785 dated Mar. 20, 2014.
Notice of Grounds of Rejection issued in Japanese Patent Application No. 2011-200247 dated Nov. 18, 2014.
Takenami et al., "Sloped Sidewalls in 4H—SiC Mesa Structure Formed by a Cl2—O2 Thermal Etching," Materials Science Forums, vol. 556-557 (2007) pp. 733-736.
Notification of First Office Action issued in Chinese Patent Application No. 201180018742.1 dated Oct. 15, 2014.
Notice of Grounds of Rejection issued in Japanese Patent Application No. 2011-208679 dated Jan. 6, 2015.
Notice of Grounds of Rejection issued in Japanese Patent Application No. 2011-253614 dated Jan. 13, 2015.
Hatayama et al., "Evaluation of Crystallinity in 4H—SiC{0001} Epilayers Thermally Etched by Chlorine and Oxygen System," Japanese Journal of Applied Physics, vol. 45, No. 27, 2006, pp. L690-L693.
Extended European Search Report issued in European Patent Application No. 11814584.6 dated Jan. 21, 2015.

* cited by examiner

SILICON CARBIDE SEMICONDUCTOR DEVICE AND METHOD FOR MANUFACTURING SAME

BACKGROUND OF THE INVENTION

1. Field of the Invention

The present invention relates to a silicon carbide semiconductor device and a method for manufacturing the silicon carbide semiconductor device, more particularly, a silicon carbide semiconductor device including a silicon carbide layer provided with a trench as well as a method for manufacturing the silicon carbide semiconductor device.

2. Description of the Background Art

Conventionally, it has been proposed to use silicon carbide (SiC) as a material for a semiconductor device. For example, it is proposed to use silicon carbide to form a trench gate type MOSFET (Metal Oxide Semiconductor Field Effect Transistor) (see Japanese Patent Laying-Open No. 2008-235546).

In this publication, it is proposed to form tapering side walls of a gate trench in order to improve breakdown voltage of a gate insulating film. Specifically, a semiconductor layer made of silicon carbide is partially removed by anisotropic etching using an etching mask having an opening pattern, and then is subjected to isotropic etching, whereby the gate trench formed in the semiconductor layer is provided with the tapering side walls.

In the case where the side walls are formed by the isotropic etching as disclosed in this publication, it is difficult for the side walls to correspond to a semi-polar plane such as a plane having a plane orientation of {0-33-8}. This makes it difficult to sufficiently increase channel mobility along each of the side walls.

SUMMARY OF THE INVENTION

To address this, the present inventors have found a method for allowing each of the side walls of the trench to correspond to the so-called semi-polar plane such as the plane having a plane orientation of {0-33-8}. Also, the present inventors have found a method for suppressing variation of channel lengths when applying this method. When the variation of channel lengths is large, for example, device properties such as threshold values of MOSFETs are varied.

The present invention has been made to solve the foregoing problem and has its object to provide a silicon carbide semiconductor device and a method for manufacturing the silicon carbide semiconductor device so as to increase channel mobility and suppress variation of channel lengths.

A silicon carbide semiconductor device of the present invention includes a substrate and a silicon carbide layer. The substrate is made of silicon carbide having a single-crystal structure of one of hexagonal system and cubic system. Further, the substrate is provided with a main surface having an off angle of 5° or smaller relative to a reference plane. The reference plane is a {000-1} plane in the case of the hexagonal system and is a {111} plane in the case of the cubic system. The silicon carbide layer is epitaxially formed on the main surface of the substrate. The silicon carbide layer is provided with a trench having first and second side walls opposite to each other. Each of the first and second side walls includes a channel region. Each of the first and second side walls substantially includes one of a {0-33-8} plane and a {01-1-4} plane in the case of the hexagonal system and substantially includes a {100} plane in the case of the cubic system.

Here, the expression "the side wall substantially includes one of the {0-33-8} plane and the {01-1-4} plane" is intended to indicate that the crystal plane constituting the side wall is one of the {0-33-8} plane and the {01-1-4} plane, and that the crystal plane constituting the side wall is a plane having an off angle of not less than −3° and not more than 3° relative to the {0-33-8} plane or the {01-1-4} plane in the <1-100> direction. It should be noted that the "off angle relative to the {0-33-8} plane or the {01-1-4} plane in the <1-100> direction" refers to an angle formed by an orthogonal projection of a normal line of the above-described side wall to a flat plane defined by the <1-100> direction and the <0001> direction, and a normal line of the {0-33-8} plane or the {01-1-4} plane. The sign of positive value corresponds to a case where the orthogonal projection approaches in parallel with the <1-100> direction whereas the sign of negative value corresponds to a case where the orthogonal projection approaches in parallel with the <0001> direction. Further, the expression "the side wall substantially includes the {100} plane" refers to a case where the crystal plane constituting the side wall is the {100} plane, and a case where the crystal plane constituting the side wall is a crystal plane having an off angle of not less than −3° and not more than 3° relative to the {100} plane in any crystal orientation.

According to this silicon carbide semiconductor device, the side wall substantially corresponds to one of the {0-33-8} plane, the {01-1-4} plane, and the {100} plane, i.e., corresponds to a stable semi-polar plane. By using such a side wall as a channel region, channel mobility can be increased.

Further, according to this silicon carbide semiconductor device, the main surface of the substrate has an off angle of 5° or smaller relative to the reference plane. Hence, the main surface of the silicon carbide layer epitaxially formed thereon also has an off angle of 5° or smaller relative to the reference plane. Accordingly, a difference between inclination of the first side wall relative to the main surface of the silicon carbide layer and inclination of the second side wall relative to the main surface thereof can be suppressed. Accordingly, the variation of the lengths of the channel regions along the side walls, i.e., the variation of the channel lengths can be suppressed. Preferably, the difference between the inclination of the first side wall relative to the main surface and the inclination of the second side wall relative to the main surface is 10° or smaller.

Preferably, in the silicon carbide semiconductor device, the off angle is 0.5° or greater. Accordingly, the rate of epitaxial growth on the substrate can be increased.

A method for manufacturing a silicon carbide semiconductor device in the present invention includes the following steps. A substrate is prepared. The substrate is made of silicon carbide having a single-crystal structure of one of hexagonal system and cubic system. Further, the substrate is provided with a main surface having an off angle of 5° or smaller relative to a reference plane. The reference plane is a {000-1} plane in the case of the hexagonal system and is a {111} plane in the case of the cubic system. Next, a silicon carbide layer is epitaxially formed on the main surface of the substrate. Next, a trench having first and second side walls opposite to each other is formed in the silicon carbide layer. The step of forming the trench includes the steps of: providing a mask layer having a pattern, on the silicon carbide layer; and partially etching the silicon carbide layer using the mask layer as a mask. The step of etching includes the step of forming the first and second side walls by heating the silicon carbide layer in a reactive gas containing oxygen and chlorine. Each of the first and second side walls substantially includes one of a {0-33-8} plane and a {01-1-4} plane in the case of the hexagonal system and substantially includes a {100} plane in the case of the cubic system.

The present inventors have found that by heating a silicon carbide layer (single-crystal layer of silicon carbide) while exposing the silicon carbide layer to a reactive gas containing oxygen and chlorine, surfaces thereof can be spontaneously formed to correspond to the {0-33-8} plane, the {01-1-4} plane, or the {100} plane described above.

Further, according to the above-described manufacturing method, the main surface of the substrate has an off angle of 5° or smaller relative to the reference plane. Hence, the main surface of the silicon carbide layer epitaxially formed thereon also has an off angle of 5° or smaller relative to the reference plane. Accordingly, the difference between the inclination of the first side wall relative to the main surface of the silicon carbide layer and the inclination of the second side wall relative to the main surface thereof can be suppressed. Accordingly, the variation of the lengths of the channels provided along the side walls, i.e., the variation of channel lengths can be suppressed.

Preferably in the above-described manufacturing method, the step of etching includes the step of supplying the reactive gas to the silicon carbide layer under a condition that a ratio of a flow rate of the oxygen to a flow rate of the chlorine is not less than 0.1 and not more than 2.0. Preferably, in the above-described manufacturing method, the step of etching includes the step of setting a temperature of the silicon carbide layer at not less than 700° C. and not more than 1200° C. Accordingly, a desired plane can be included more securely in each of the first and second side walls.

According to the present invention, in a silicon carbide semiconductor device having a channel region along each of side walls of a trench, channel mobility can be increased and variation of channel lengths can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
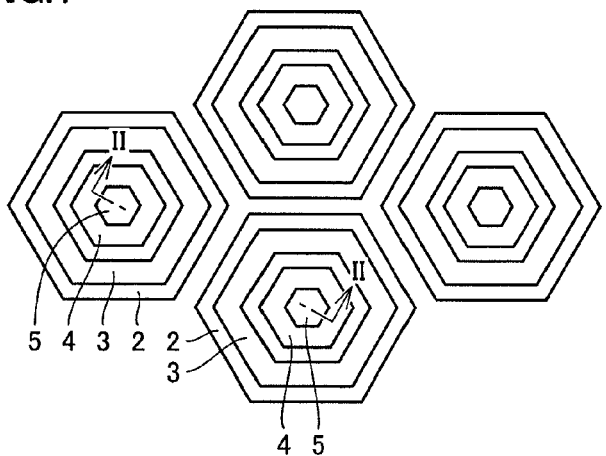
FIG. 1 is a schematic plan view showing a first embodiment of a semiconductor device according to the present invention.

The following describes embodiments of the present invention with reference to figures. It should be noted that in the below-mentioned figures, the same or corresponding portions are given the same reference characters and are not described repeatedly. Further, regarding crystallographic representations in the present specification, an individual orientation is represented by [ ], a group orientation is represented by < >, and an individual plane is represented by ( ), and a group plane is represented by { }. In addition, a negative index is supposed to be crystallographically indicated by putting "-" (bar) above a numeral, but is indicated by putting the negative sign before the numeral in the present specification. For description of an angle, a system in which an omnidirectional angle is 360° is employed.

First Embodiment

Figure 2:
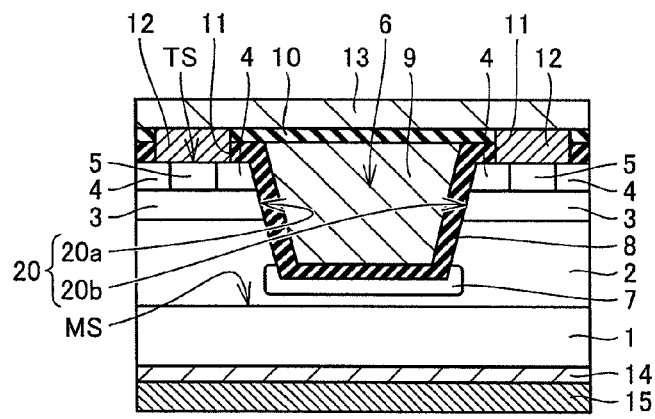
FIG. 2 is a schematic cross sectional view taken along a line II-II in FIG. 1.
Figure 3:
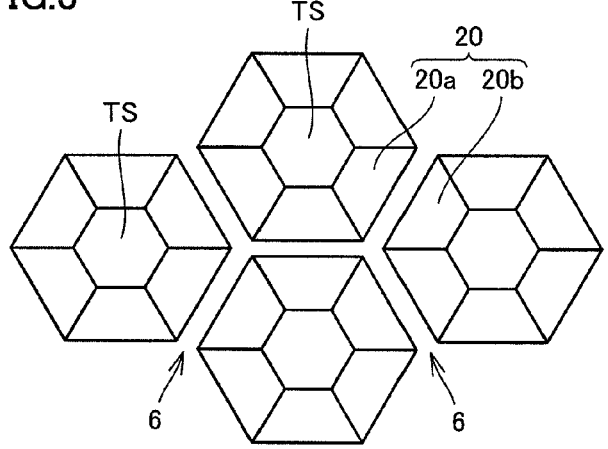
FIG. 3 is a schematic plan view showing a shape of a trench provided in a silicon carbide layer of FIG. 1 and having side walls.

Referring to FIG. 1 to FIG. 3 mainly, a semiconductor device in the present embodiment is a vertical type MOSFET having a trench gate. This semiconductor device includes: a substrate 1 made of silicon carbide, and a silicon carbide layer epitaxially formed on a main surface MS of substrate 1. The silicon carbide layer includes: a breakdown voltage holding layer 2 serving as an epitaxial layer having n type conductivity; p type body layers 3 (p type semiconductor layers 3) having p type conductivity; n type source contact layers 4 having n type conductivity; and contact regions 5 having p type conductivity.

Substrate 1 is made of silicon carbide having a single-crystal structure of one of hexagonal system and cubic system. Further, substrate 1 has main surface MS having an off angle of 5° or smaller relative to a reference plane. In the case of the hexagonal system, the reference plane is a {000-1} plane, more preferably, a (000-1) plane. In the case of the cubic system, the reference plane is a {111} plane. Preferably, the off angle is 0.5° or greater.

The silicon carbide layer is epitaxially formed on main surface MS of substrate 1, and has a main surface TS substantially parallel to main surface MS. Trench 6 has a side wall 20a (first side wall) and a side wall 20b (second side wall) opposite to each other. Trench 6 has a tapering shape getting wider toward the opening. Hence, side walls 20a and 20b are inclined relative to each other. Each of side walls 20a and 20b (also collectively referred to as "side walls 20") includes a channel region, which is a portion of p type body layer 3 on side wall 20. Further, in the case of the hexagonal system, each of side walls 20 substantially includes at least one of a {0-33-8} plane and a {01-1-4} plane. In the case of the cubic system, each of side walls 20 substantially includes a {100} plane.

Figure 4:
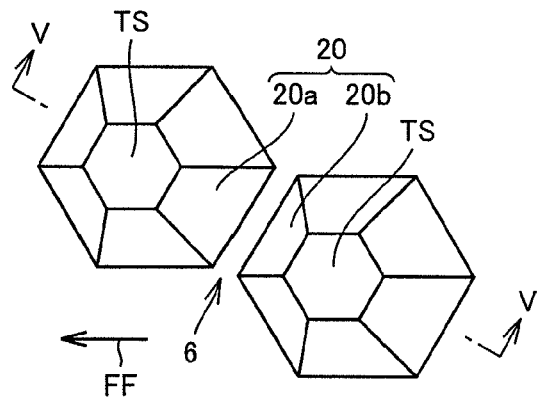
FIG. 4 is a partial enlarged view of FIG. 3 to illustrate asymmetry of the trench.
Figure 5:
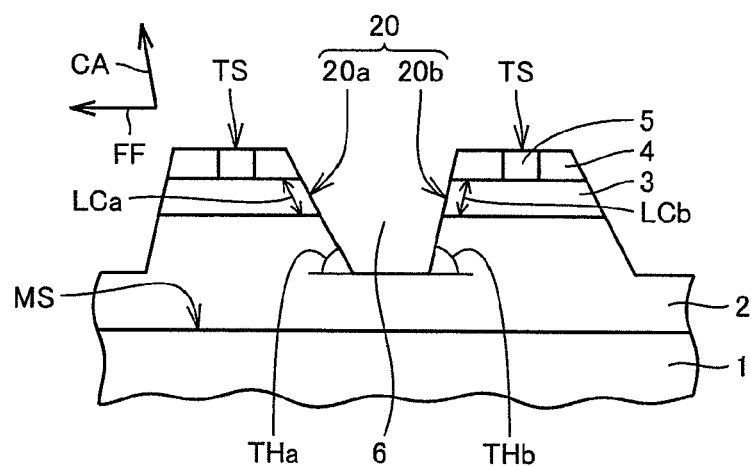
FIG. 5 is a schematic cross sectional view taken along a line V-V of FIG. 4.

Referring to FIG. 4 and FIG. 5, when the off angle of substrate 1 is not zero, each of main surfaces MS and TS is inclined relative to the reference plane. In other words, the reference plane has a normal vector CA (FIG. 5) inclined on main surface TS relative to an off orientation FF of the off angle. Meanwhile, because each of side walls 20 has a crystallographically specific plane orientation, side wall 20 is inclined by the off angle as compared with a case where the off angle thereof is zero. As a result of this inclination, side walls 20a and 20b are inclined relative to main surface TS at different angles THa and THb. This difference becomes greater as the off angle of substrate 1 is greater. Hence, this difference is restricted by restricting the upper limit of the absolute value of the off angle of substrate 1. Accordingly, the lengths of the channel regions respectively provided in side walls 20a and 20b, i.e., channel lengths LCa and LCb are also restricted. Preferably, the absolute value of the difference between angles THa and THb is 10° or smaller.

From a different point of view, the existence of trench 6 corresponds to existence of a mesa structure (FIG. 3) formed of the silicon carbide layer. This mesa structure has side walls 20 and an upper surface constituted of main surface TS surrounded by side walls 20. Preferably, this upper surface has a hexagonal shape as shown in FIG. 3 in the case of the hexagonal system, and has a rectangle or square shape in the case of the cubic system.

Further, the semiconductor device has a gate insulating film 8, a gate electrode 9, an interlayer insulating film 10, source electrodes 12, a source wire electrode 13, a drain electrode 14, and a backside surface protecting electrode 15.

The following describes details of the semiconductor device. Breakdown voltage holding layer 2 is formed on one main surface of substrate 1. Each of p type body layers 3 is formed on breakdown voltage holding layer 2. On p type body layer 3, n type source contact layer 4 is formed. P type contact region 5 is formed to be surrounded by n type source contact layer 4. By removing portions of n type source contact layer 4, p type body layer 3, and breakdown voltage holding layer 2, the mesa structures surrounded by trench 6 are formed.

Gate insulating film 8 is formed on side walls 20 and bottom wall of trench 6. Gate insulating film 8 extends onto the upper surface of each of n type source contact layers 4. Gate electrode 9 is formed on gate insulating film 8 to fill the inside of trench 6 (i.e., fill the space between adjacent mesa structures). Gate electrode 9 has an upper surface substantially as high as the upper surface of a portion of gate insulating film 8 on the upper surface of each of n type source contact layers 4.

Interlayer insulating film 10 is formed to cover gate electrode 9 as well as the portion of gate insulating film 8 on the upper surface of each of n type source contact layers 4. By removing portions of interlayer insulating film 10 and gate insulating film 8, openings 11 are formed to expose portions of n type source contact layers 4 and p type contact regions 5. Source electrodes 12 are formed in contact with p type contact regions 5 and the portions of n type source contact layers 4 so as to fill the inside of openings 11. Source wire electrode 13 is formed in contact with the upper surface of source electrode 12 so as to extend on the upper surface of interlayer insulating film 10. Further, drain electrode 14 is formed on the backside surface of substrate 1 opposite to its main surface on which breakdown voltage holding layer 2 is formed. This drain electrode 14 is an ohmic electrode. Drain electrode 14 has a surface which is opposite to its surface facing substrate 1 and on which a backside surface protecting electrode 15 is formed.

In the semiconductor device shown in FIG. 1 and FIG. 2, each of side walls 20 of trench 6 (each of the side walls of the mesa structures) is inclined and substantially corresponds to the {0-33-8} plane in the case where the silicon carbide constituting breakdown voltage holding layer 2 and the like is of hexagonal crystal type. Specifically, the crystal plane constituting the side wall is a plane having an off angle of not less than $-3°$ and not more than 3°, more preferably, not less than $-1°$ and not more than 1° relative to the {0-33-8} plane in the <1-100> direction. As seen from FIG. 2, each of the side walls thus corresponding to the so-called "semi-polar plane" can be used as a channel region, which is an active region of the semiconductor device. Because each of the side walls corresponds to the stable crystal plane, a higher channel mobility can be obtained in the case where such a side wall is employed for the channel region, as compared with a case where another crystal plane (such as the (0001) plane) is employed for the channel region. In addition, leakage current can be reduced sufficiently and high breakdown voltage can be obtained.

The following briefly describes operations of the semiconductor device. Referring to FIG. 2, when a voltage equal to or smaller than the threshold value is applied to gate electrode 9, i.e., when the semiconductor device is in an OFF state, p type body layer 3 and breakdown voltage holding layer 2 of n type conductivity are reverse-biased. Hence, it is in a non-conductive state. On the other hand, when gate electrode 9 is fed with a positive voltage, an inversion layer is formed in the channel region near a region of p type body layer 3 in contact with gate insulating film 8. Accordingly, n type source contact layer 4 and breakdown voltage holding layer 2 are electrically connected to each other. As a result, a current flows between source electrode 12 and drain electrode 14.

The following describes a method for manufacturing the semiconductor device shown in FIG. 1 and FIG. 2 in the present invention, with reference to FIG. 6 to FIG. 14.

Figure 6:
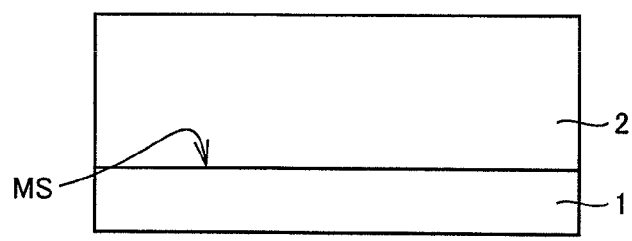
FIG. 6 is a schematic cross sectional view for illustrating a method for manufacturing the semiconductor device shown in FIG. 1 and FIG. 2.

First, referring to FIG. 6, substrate 1 made of silicon carbide is prepared. Substrate 1 has a single-crystal structure of one of hexagonal system and cubic system. Further, substrate 1 is provided with main surface MS having an off angle of 5° or smaller relative to the above-described reference plane. In the case of the hexagonal system, the reference plane is a {000-1} plane. In the case of the cubic system, the reference plane is a {111} plane. Next, on main surface MS of substrate 1, an epitaxial layer of silicon carbide with n type conductivity is formed. The epitaxial layer serves as breakdown voltage holding layer 2. Breakdown voltage holding layer 2 is formed by means of epitaxial growth employing a CVD (Chemical Vapor Deposition) method that utilizes a mixed gas of silane ($SiH_4$) and propane ($C_3H_8$) as a material gas and utilizes hydrogen gas ($H_2$) as a carrier gas, for example. In doing so, it is preferable to introduce nitrogen (N) or phosphorus (P) as an impurity of n type conductivity, for example. This breakdown voltage holding layer 2 contains the n type impurity at a concentration of, for example, not less than $5 \times 10^{15}$ cm$^{-3}$ and not more than $5 \times 10^{16}$ cm$^{-3}$.

Figure 7:
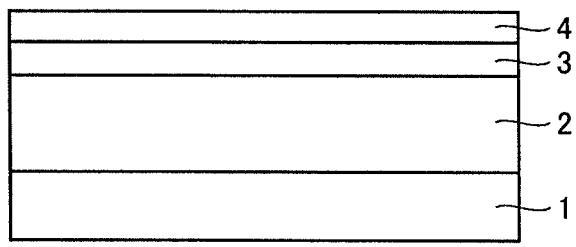
FIG. 7 is a schematic cross sectional view for illustrating the method for manufacturing the semiconductor device shown in FIG. 1 and FIG. 2.

Next, as shown in FIG. 7, ions are implanted into the upper surface layer of breakdown voltage holding layer 2, thereby forming p type body layer 3 and n type source contact layer 4. In the ion implantation for forming p type body layer 3, ions of an impurity of p type conductivity such as aluminum (Al) are implanted. In doing so, by adjusting acceleration energy of the ions to be implanted, the depth of the region in which p type body layer 3 is to be formed can be adjusted. Further, ions of an impurity of n type conductivity are implanted into breakdown voltage holding layer 2 thus having p type body layer 3 formed therein, thereby forming n type source contact layer 4. An exemplary, usable n type impurity is phosphorus or the like.

Figure 8:
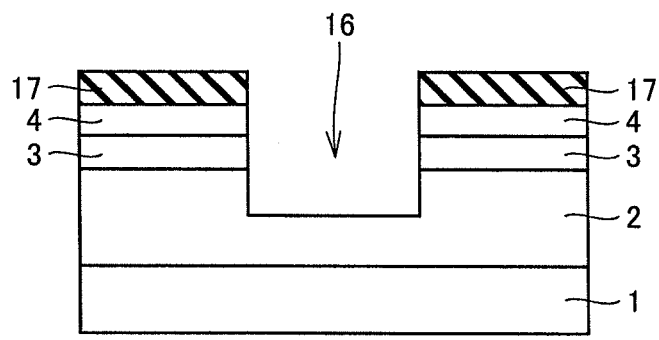
FIG. 8 is a schematic cross sectional view for illustrating the method for manufacturing the semiconductor device shown in FIG. 1 and FIG. 2.

Next, as shown in FIG. 8, a mask layer 17 is formed on the upper surface of n type source contact layer 4. As mask layer 17, an insulating film such as a silicon oxide film can be used. As a method for forming mask layer 17, the following process can be employed, for example. That is, a silicon oxide film is formed on the upper surface of n type source contact layer 4 by means of the CVD method or the like. Then, a resist film (not shown) having a predetermined opening pattern is formed on the silicon oxide film by means of the photolithography method. Using the resist film as a mask, a portion of the silicon oxide film is removed by etching. Thereafter, the resist film is removed. As a result, mask layers 17 are formed which have an opening pattern in conformity with a region where trench 16 shown in FIG. 8 is to be formed.

Then, using mask layers 17 as a mask, portions of n type source contact layer 4, p type body layer 3, and breakdown voltage holding layer 2 are removed by means of etching. An exemplary, usable etching method is reactive ion etching (RIE), or ion milling. As the RIE, inductively coupled plasma (ICP) RIE can be used in particular. Specifically, for example, ICP-RIE can be employed which utilizes $SF_6$ or mixed gas of $SF_6$ and $O_2$ as reactive gas. By means of such etching, a trench 16 having side walls substantially perpendicular to the main surface of substrate 1 can be formed in the region where trench 6 shown in FIG. 2 is to be formed.

Figure 9:
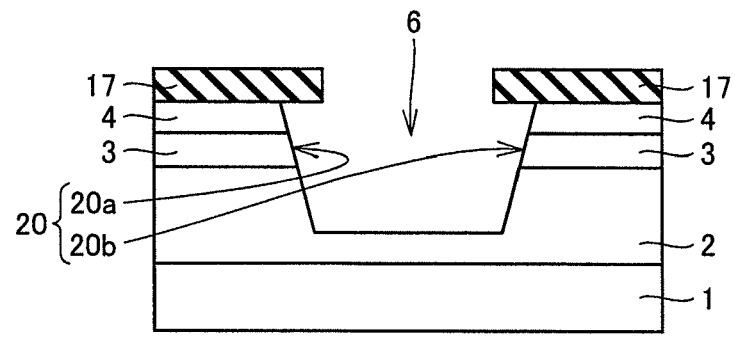
FIG. 9 is a schematic cross sectional view for illustrating the method for manufacturing the semiconductor device shown in FIG. 1 and FIG. 2.

Next, as shown in FIG. 9, a thermal etching step is performed to exhibit a predetermined crystal plane in each of breakdown voltage holding layer 2, p type body layer 3, and n type source contact layer 4. Specifically, the side walls of trench 16 (FIG. 8) were etched (thermally etched) using a mixed gas of oxygen gas and chlorine gas as a reactive gas, at a heat treatment temperature of, for example, not less than 700° C. and not more than 1200° C. Preferably, the heat treatment temperature is not less than 700° C. and not more than 1200° C. The lower limit of this temperature is more preferably 800° C., further preferably 900° C. Further, the upper limit of this temperature is more preferably 1100° C., further preferably 1000° C. In this case, the etching rate can be a sufficiently practical value in the thermal etching step of forming the surface including the {0-33-8} plane, the {01-1-4} plane, or the {100} plane. Accordingly, the process time in this step can be sufficiently short.

Here, main reaction in the above-described thermal etching step proceeds under conditions that $0.5 \le x \le 2.0$ and $1.0 \le y \le 2.0$ are satisfied in a reaction formula expressed as $SiC + mO_2 + nCl_2 \rightarrow SiCl_x + CO_y$, where m, n, x, and y are positive numbers. Under conditions that x=4 and y=2, the reaction (thermal etching) proceeds the most. It should be noted that m and n described above respectively represent amounts of the oxygen gas and the chlorine gas actually reacting, and are therefore different from amounts of the oxygen gas and the chlorine gas supplied as process gas. The present inventors have found that a ratio of the flow rate of oxygen to the flow rate of chlorine in this thermal etching is preferably not less than 0.1 and not more than 2.0. More preferably, the lower limit of this ratio is 0.25. In this case, a surface including the {0-33-8} plane, the {01-1-4} plane, or the {100} plane can be securely formed.

It should be noted that the reactive gas may contain a carrier gas in addition to the chlorine gas and the oxygen gas. An exemplary, usable carrier gas is nitrogen ($N_2$) gas, argon gas, helium gas, or the like. When the heat treatment temperature is set at not less than 700° C. and not more than 1000° C. as described above, a rate of etching SiC is approximately, for example, 70 μm/hr. Further, when using silicon oxide ($SiO_2$) as each of mask layers 17 in this case, a selection ratio of SiC to $SiO_2$ can be very large. Accordingly, mask layer 17 made of $SiO_2$ is not substantially etched during etching of SiC.

It should be noted that in the case of the hexagonal system, the crystal plane exhibited at each of side walls 20 may substantially correspond to the {0-33-8} plane. Namely, in the etching under the above-described conditions, side wall 20 of trench 6 is spontaneously formed to correspond to the {0-33-8} plane, which is a crystal plane allowing for the slowest etching rate. As a result, a structure shown in FIG. 9 is obtained. It should be noted that the crystal plane constituting side wall 20 may be a {01-1-4} plane. In the case of the cubic system, the crystal plane constituting side wall 20 may be a {100} plane.

Figure 10:
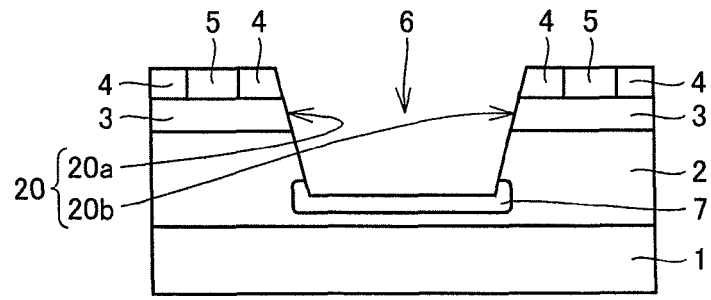
FIG. 10 is a schematic cross sectional view for illustrating the method for manufacturing the semiconductor device shown in FIG. 1 and FIG. 2.
Figure 11:
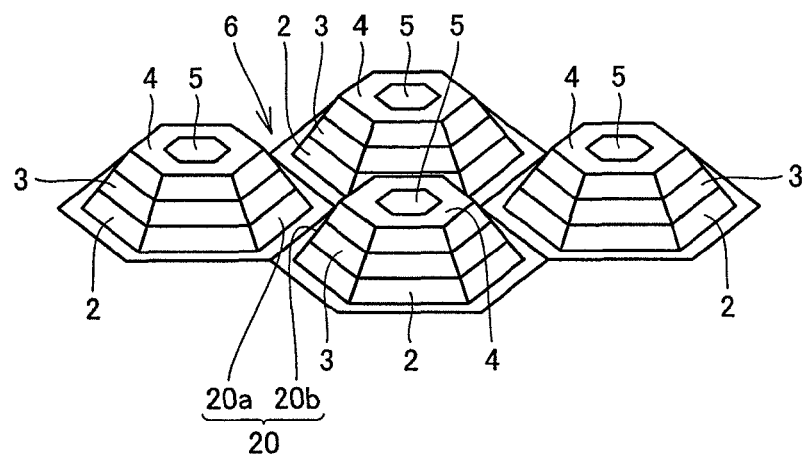
FIG. 11 is a schematic perspective view for illustrating the method for manufacturing the semiconductor device shown in FIG. 1 and FIG. 2.

Next, each of mask layers 17 is removed by means of an appropriate method such as etching. Thereafter, a resist film (not shown) having a predetermined pattern is formed using a photolithography method so as to extend from the inside of trench 6 onto each of the upper surfaces of n type source contact layers 4. As the resist film, there can be used a resist film having an opening pattern in conformity with the bottom portion of trench 6 and a portion of the upper surface of n type source contact layer 4. By implanting ions of an impurity of p type conductivity using this resist film as a mask, an electric field relaxing region 7 is formed at the bottom portion of trench 6 and contact region 5 of p type conductivity is formed at the region of the portion of n type source contact layer 4. Thereafter, the resist film is removed. As a result, a structure shown in FIG. 10 and FIG. 11 is obtained. As seen from FIG. 11, trench 6 has a planar shape in the form of a mesh constituted by unit cells (each defined by annular portion of trench 6 surrounding one mesa structure) each having a hexagonal planar shape. Further, p type contact region 5 is disposed substantially at the central portion of the upper surface of each of the mesa structures as shown in FIG. 11. Further, p type contact region 5 has a planar shape similar to the shape of circumference of the upper surface of the mesa structure, i.e., has a hexagonal planar shape.

Then, an activation annealing step is performed to activate the impurity implanted by means of the above-described ion implantation. In this activation annealing step, the annealing treatment is performed without forming any particular cap layer on the surface of the epitaxial layer made of silicon carbide (for example, on the side wall of the mesa structure). Here, the inventors have found that even when the activation annealing treatment is performed without forming a protective film such as the cap layer on the surface thereof in the case where the above-described {0-33-8} plane is employed, a property of the surface is never deteriorated and sufficient surface smoothness can be maintained. Thus, the conventionally required step of forming the protective film (cap layer) before the activation annealing treatment is omitted and the activation annealing step is directly performed. It should be noted that the above-described cap layer may be formed before performing the activation annealing step. Alternatively, for example, the cap layer may be provided only on the upper surfaces of n type source contact layer 4 and p type contact region 5 before performing the activation annealing treatment.

Figure 12:
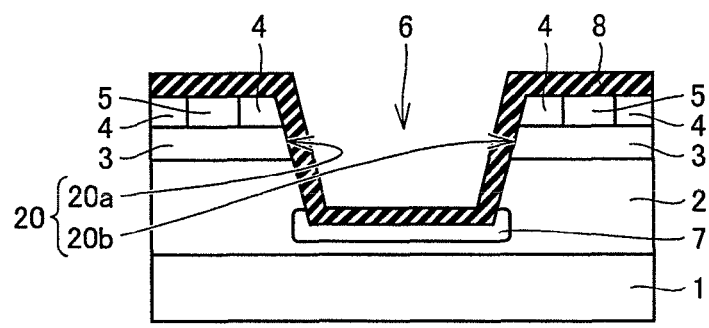
FIG. 12 is a schematic cross sectional view for illustrating the method for manufacturing the semiconductor device shown in FIG. 1 and FIG. 2.

Next, as shown in FIG. 12, gate insulating film 8 is formed to extend from the inside of trench 6 onto the upper surfaces of n type source contact layer 4 and p type contact region 5. As gate insulating film 8, for example, there can be used an oxide film (silicon oxide film) obtained by thermally oxidizing the epitaxial layer made of silicon carbide.

Figure 13:
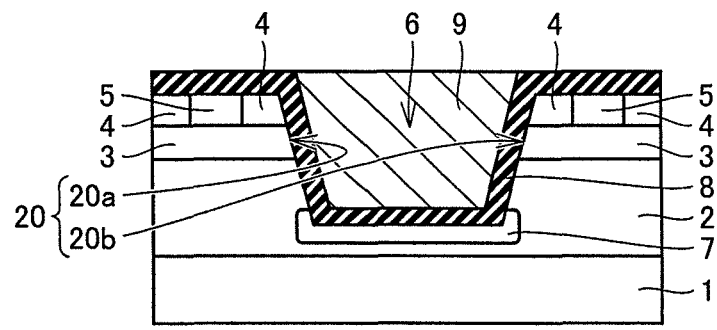
FIG. 13 is a schematic cross sectional view for illustrating the method for manufacturing the semiconductor device shown in FIG. 1 and FIG. 2.

Next, as shown in FIG. 13, gate electrode 9 is formed on gate insulating film 8 so as to fill the inside of trench 6. As a method for forming gate electrode 9, the following method can be used, for example. First, a sputtering method or the like is employed to form a conductor film on gate insulating film 8. The conductor film is to be the gate electrode extending to the inside of trench 6 and to a region on p type contact region 5. The conductor film may be made of any material such as a metal as long as the material has conductivity. Thereafter, an appropriate method such as an etch back method or a CMP (Chemical Mechanical Polishing) method is used to remove a portion of the conductor film formed on regions other than the inside of trench 6. As a result, the conductor film filling the inside of trench 6 remains to constitute gate electrode 9.

Next, interlayer insulating film 10 (see FIG. 14) is formed to cover the upper surface of gate electrode 9 and the upper surface of gate insulating film 8 exposed on p type contact region 5. The interlayer insulating film can be made of any material as long as the material is insulative. Further, a resist film having a pattern is formed on interlayer insulating film 10, using the photolithography method. The resist film (not shown) is provided with an opening pattern formed in conformity with a region on p type contact region 5.

Using this resist film as a mask, portions of interlayer insulating film 10 and gate insulating film 8 are removed by means of etching. As a result, openings 11 (see FIG. 14) are formed to extend through interlayer insulating film 10 and gate insulating film 8. Each of openings 11 has a bottom portion at which p type contact region 5 and a portion of n type source contact layer 4 are exposed. Thereafter, a conductor film to serve as source electrode 12 (see FIG. 14) is formed to fill the inside of opening 11 and cover the upper surface of the above-described resist film. Thereafter, the resist film is removed using a chemical solution or the like, thereby simultaneously removing (lifting off) the portion of the conductor film formed on the resist film. As a result, the conductor film filling the inside of opening 11 constitutes source electrode 12. This source electrode 12 is an ohmic electrode making ohmic contact with p type contact region 5 and n type source contact layer 4.

Figure 14:
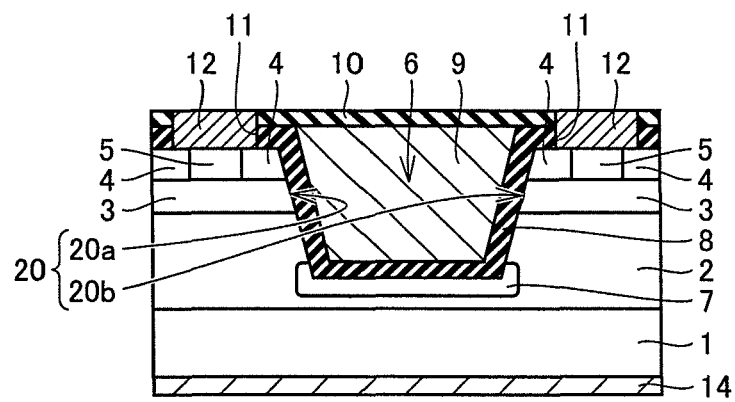
FIG. 14 is a schematic cross sectional view for illustrating the method for manufacturing the semiconductor device shown in FIG. 1 and FIG. 2.

Further, drain electrode 14 (see FIG. 14) is formed on the backside surface of substrate 1 (the surface thereof opposite to the main surface thereof on which breakdown voltage holding layer 2 is formed). Drain electrode 14 can be made of any material as long as the material allows for ohmic contact with substrate 1. In this way, a structure shown in FIG. 14 is obtained.

Thereafter, an appropriate method such as the sputtering method is employed to form source wire electrode 13 (see FIG. 2) and backside surface protecting electrode 15 (see FIG. 2). Source wire electrode 13 makes contact with each of the upper surfaces of source electrodes 12, and extends on the upper surface of interlayer insulating film 10. Backside surface protecting electrode 15 is formed on the surface of drain electrode 14. As a result, the semiconductor device shown in FIG. 1 and FIG. 2 can be obtained.

Figure 15:
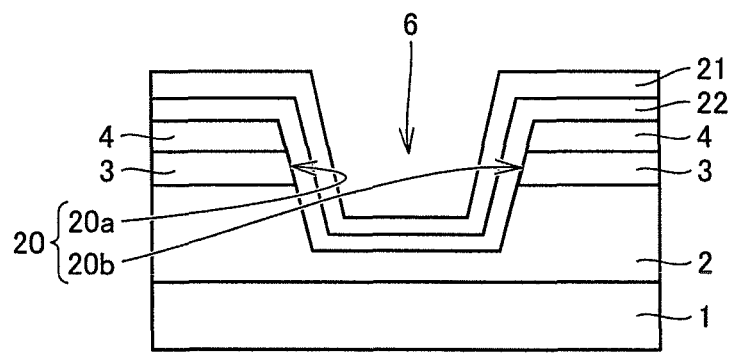
FIG. 15 is a schematic cross sectional view for illustrating a variation of the method for manufacturing the semiconductor device shown in FIG. 1 and FIG. 2.
Figure 16:
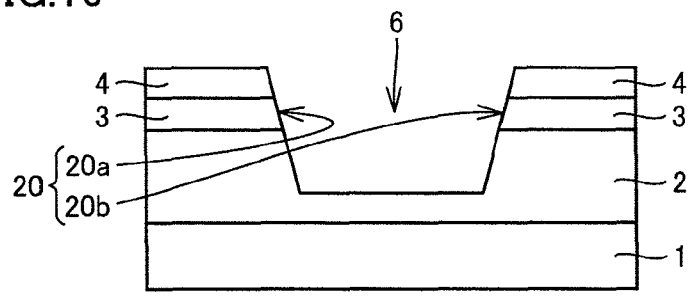
FIG. 16 is a schematic cross sectional view for illustrating the variation of the method for manufacturing the semiconductor device shown in FIG. 1 and FIG. 2.

Referring to FIG. 15 and FIG. 16, the following describes a variation of the method for manufacturing the semiconductor device shown in FIG. 1 and FIG. 2 in the present invention.

In the variation of the method for manufacturing the semiconductor device in the present invention, the steps shown in FIG. 6 to FIG. 8 are performed first. Thereafter, mask layers 17 shown in FIG. 8 are removed. Next, a Si film 21 (see FIG. 15) made of silicon is formed to extend from the inside of trench 16 to the upper surface of n type source contact layer 4. In this state, heat treatment is performed to cause reconstitution of silicon carbide at a region in contact with Si film 21 on the inner circumferential surface of trench 16 and the upper surface of n type source contact layer 4. Accordingly, a reconstitution layer 22 of silicon carbide is formed as shown in FIG. 15 such that each of the side walls of the trench corresponds to a predetermined crystal plane ({0-33-8} plane). As a result, a structure shown in FIG. 15 is obtained.

Thereafter, remaining Si film 21 is removed. Si film 21 can be removed by means of, for example, etching that uses a mixed gas of $HNO_3$ and HF or the like. Thereafter, the surface layer of reconstitution layer 22 described above is removed by means of etching. As etching for removing reconstitution layer 22, ICP-RIE can be used. As a result, trench 6 having its inclined side surfaces as shown in FIG. 16 can be formed.

Thereafter, by performing the above-described steps shown in FIG. 10 to FIG. 14, the semiconductor device shown in FIG. 1 and FIG. 2 can be obtained.

Figure 17:
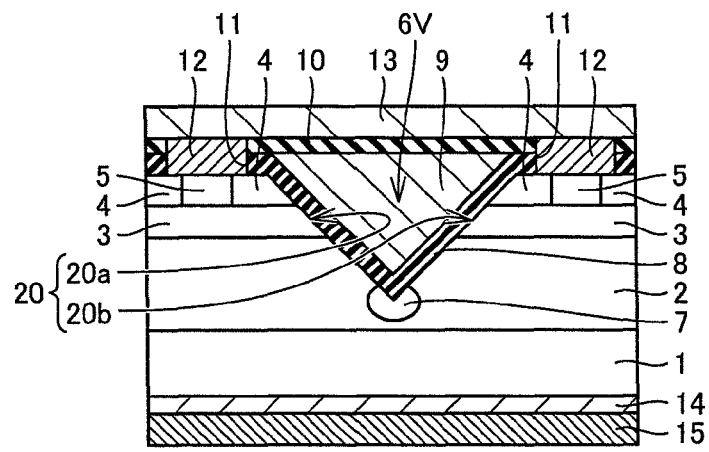
FIG. 17 is a schematic cross sectional view showing a variation of the semiconductor device shown in FIG. 1 and FIG. 2.

Next, referring to FIG. 17, a variation of the semiconductor device shown in FIG. 1 and FIG. 2 is described. A semiconductor device shown in FIG. 17 basically has the same configuration as that of the semiconductor device shown in FIG. 1 and FIG. 2, but is different therefrom in terms of the shape of trench 6. Specifically, in the semiconductor device shown in FIG. 17, trench 6 has a V-shaped cross sectional shape. Further, from a different point of view, trench 6 of the semiconductor device shown in FIG. 17 has side surfaces inclined relative to the main surface of substrate 1, opposite to each other, and directly connected to each other at their lower portions. At the bottom portion of trench 6 (the portion at which the lower portions of the opposite side walls are connected to each other), an electric field relaxing region 7 is formed.

With the semiconductor device thus configured, there can be provided the same effect as that of the semiconductor device shown in FIG. 1 and FIG. 2. Further, in the semiconductor device shown in FIG. 17, trench 6 does not have the flat bottom surface shown in FIG. 2. Accordingly, trench 6 shown in FIG. 17 has a width narrower than that of trench 6 shown in FIG. 2. As a result, the semiconductor device shown in FIG. 17 can be reduced in size as compared with the semiconductor device shown in FIG. 2. This is advantageous in attaining finer design and higher integration of the semiconductor device.

Second Embodiment

The semiconductor device in the first embodiment is the MOSFET including trench 6 (FIG. 5) having side walls 20a and 20b. A semiconductor device in a second embodiment is an insulated gate bipolar transistor (IGBT) having a similar trench 6. The following describes details thereof.

Figure 18:
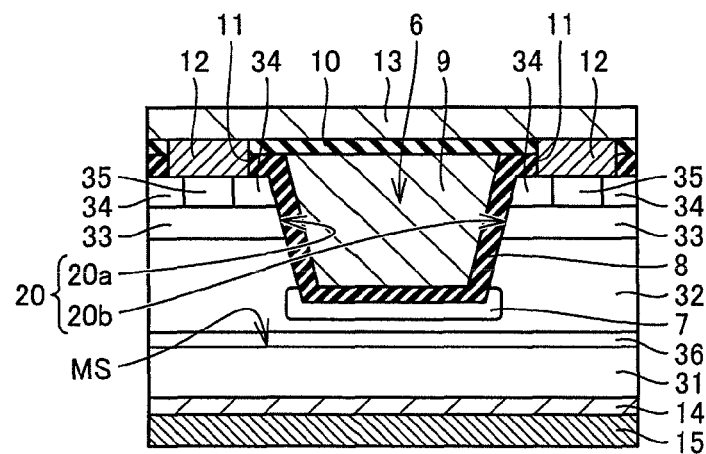
FIG. 18 is a schematic cross sectional view showing a second embodiment of a semiconductor device according to the present invention.

As shown in FIG. 18, the semiconductor device includes: a substrate 31 made of silicon carbide and having p type conductivity; a p type epitaxial layer 36 made of silicon carbide and serving as a buffer layer having p type conductivity; an n type epitaxial layer 32 made of silicon carbide and serving as a breakdown voltage holding layer having n type conductivity; p type semiconductor layers 33 made of silicon carbide and corresponding to a well region having p type conductivity; n type source contact layers 34 made of silicon carbide and corresponding to an emitter region having n type conductivity; contact regions 35 made of silicon carbide and having p type conductivity; a gate insulating film 8; a gate electrode 9; an interlayer insulating film 10; a source electrode 12 corresponding to an emitter electrode; a source wire electrode 13; a drain electrode 14 corresponding to a collector electrode; and a backside surface protecting electrode 15.

P type epitaxial layer 36 serving as the buffer layer is formed on one main surface MS of substrate 31. On p type epitaxial layer 36, n type epitaxial layer 32 is formed. On n type epitaxial layer 32, each of p type semiconductor layers 33 is formed. On p type semiconductor layer 33, n type source contact layer 34 is formed. P type contact region 35 is formed and surrounded by n type source contact layer 34. By removing portions of n type source contact layer 34, p type semiconductor layer 33, and n type epitaxial layer 32, a trench 6 is formed. Each of side walls 20 of trench 6 serves an end surface inclined relative to main surface MS of substrate 31. The inclined end surface surrounds a projection portion (mesa structure in the form of a projection-shaped portion having an upper surface on which source electrode 12 is formed). The projection portion has a hexagonal planar shape as with that of the semiconductor device shown in FIG. 1 or the like.

Gate insulating film 8 is formed on side walls 20 and bottom wall of trench 6. Gate insulating film 8 extends onto the upper surface of n type source contact layer 34. On this gate insulating film 8, gate electrode 9 is formed to fill the inside of trench 6. Gate electrode 9 has an upper surface substantially as high as the upper surface of a portion of gate insulating film 8 on the upper surface of n type source contact layer 34.

Interlayer insulating film 10 is formed to cover gate electrode 9 as well as the portion of gate insulating film 8 on the upper surface of n type source contact layer 34. By removing portions of interlayer insulating film 10 and gate insulating film 8, openings 11 are formed to expose portions of n type source contact layers 34 and p type contact regions 35. Source electrodes 12 are formed in contact with p type contact regions 35 and the portions of n type source contact layers 34 so as to fill the inside of openings 11. Source wire electrode 13 is formed in contact with the upper surface of source electrode 12 so as to extend on the upper surface of interlayer insulating film 10.

Further, as with the semiconductor device shown in FIG. 1 and FIG. 2, drain electrode 14 and backside surface protecting electrode 15 are formed on the backside surface of substrate 31 opposite to its main surface on which n type epitaxial layer 32 is formed.

As with the semiconductor device shown in FIG. 1 and FIG. 2, in the semiconductor device shown in FIG. 18, each of side walls 20 of trench 6 is inclined and substantially corresponds to the {0-33-8} plane in the case where the silicon carbide constituting n type epitaxial layer 32 and the like is of hexagonal crystal type. Also in this case, an effect similar to that of the semiconductor device shown in FIG. 1 can be obtained. It should be noted that side wall 20 in the semiconductor device of each of the first and second embodiments may substantially correspond to the {01-1-4} plane. Further, in the case where the crystal type of silicon carbide constituting n type epitaxial layer 32 or the like is cubic crystal, inclined side wall 20 of trench 6 may correspond to substantially the {100} plane.

The following briefly describes operations of the semiconductor device shown in FIG. 18.

When a negative voltage is applied to gate electrode 9 and exceeds a threshold value, an inversion layer is formed at an end region (channel region) of p type semiconductor layer 33 that is in contact with gate insulating film 8 disposed lateral to gate electrode 9 and that faces trench 6. Accordingly, n type source contact layer 34 serving as the emitter region and n type epitaxial layer 32 serving as the breakdown voltage holding layer are electrically connected to each other. Accordingly, electrons are injected from n type source contact layer 34 serving as the emitter region to n type epitaxial layer 32 serving as the breakdown voltage holding layer. Correspondingly, positive holes are supplied from substrate 31 to n type epitaxial layer 32 via p type epitaxial layer 36 serving as the buffer layer. As a result, conductivity modulation takes place in n type epitaxial layer 32 to significantly decrease a resistance between source electrode 12 serving as the emitter electrode and drain electrode 14 serving as the collector electrode. In other words, the IGBT is brought into ON state.

On the other hand, when the negative voltage applied to gate electrode 9 is equal to or smaller than the threshold value, the inversion layer is not formed in the channel region. Hence, the reverse-biased state is maintained between n type epitaxial layer 32 and p type semiconductor layer 33. As a result, the IGBT is brought into the OFF state, whereby no current flows therein.

Referring to FIG. 19 to FIG. 26, the following describes the method for manufacturing the semiconductor device of the second embodiment in the present invention.

Figure 19:
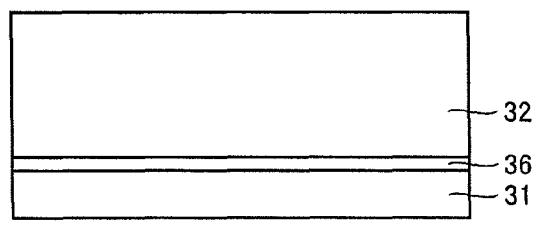
FIG. 19 is a schematic cross sectional view for illustrating the method for manufacturing the semiconductor device shown in FIG. 18.

First, referring to FIG. 19, substrate 31 having p type conductivity and made of silicon carbide is prepared. The crystallographic characteristics of substrate 31 are substantially the same as those of substrate 1 of the first embodiment apart from its conductivity type.

Next, on the main surface MS of substrate 31, p type epitaxial layer 36 made of silicon carbide and having p type conductivity is formed. Further, on p type epitaxial layer 36, n type epitaxial layer 32 of silicon carbide of n type conductivity is formed. N type epitaxial layer 32 serves as breakdown voltage holding layer 32. P type epitaxial layer 36 and n type epitaxial layer 32 are formed by means of epitaxial growth employing the CVD method that utilizes a mixed gas of silane ($SiH_4$) and propane ($C_3H_8$) as a material gas, and utilizes a hydrogen gas ($H_2$) as a carrier gas, for example. In doing so, it is preferable to introduce, for example, aluminum (Al) as the impurity of p type conductivity, and to introduce, for example, nitrogen (N) or phosphorus (P) as the impurity of n type conductivity.

Next, ions are implanted into the upper surface layer of n type epitaxial layer 32, thereby forming p type semiconductor layer 33 and n type source contact layer 34. In the ion implantation for forming p type semiconductor layer 33, ions of an impurity of p type conductivity such as aluminum (Al) are implanted. In doing so, by adjusting acceleration energy of the ions to be implanted, the depth of the region in which p type semiconductor layer 33 is to be formed can be adjusted.

Figure 20:
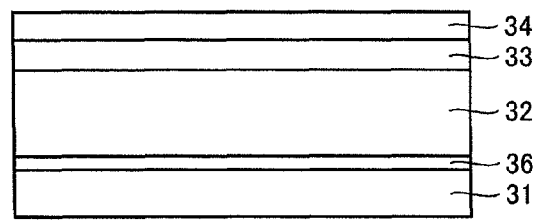
FIG. 20 is a schematic cross sectional view for illustrating the method for manufacturing the semiconductor device shown in FIG. 18.

Next, ions of an impurity of n type conductivity are implanted into n type epitaxial layer 32 thus having p type semiconductor layer 33 formed thereon, thereby forming n type source contact layer 34. An exemplary, usable n type impurity is phosphorus or the like. In this way, a structure shown in FIG. 20 is obtained.

Figure 21:
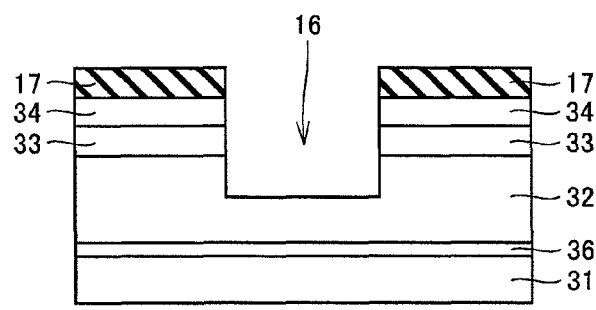
FIG. 21 is a schematic cross sectional view for illustrating the method for manufacturing the semiconductor device shown in FIG. 18.

Next, as shown in FIG. 21, a mask layer 17 is formed on the upper surface of n type source contact layer 34. As mask layer 17, an insulating film such as a silicon oxide film can be used. As a method for forming mask layer 17, the same method as the method for manufacturing mask layer 17 as illustrated in FIG. 8 can be used. As a result, mask layers 17 are formed which have an opening pattern in conformity with a region where trench 16 shown in FIG. 21 is to be formed.

Then, using mask layers 17 as a mask, portions of n type source contact layer 34, p type semiconductor layer 33, and n type epitaxial layer 32 are removed by means of etching. As a method or the like for the etching, substantially the same method can be used as that of the process illustrated in FIG. 8. In this way, a structure shown in FIG. 21 is obtained.

Figure 22:
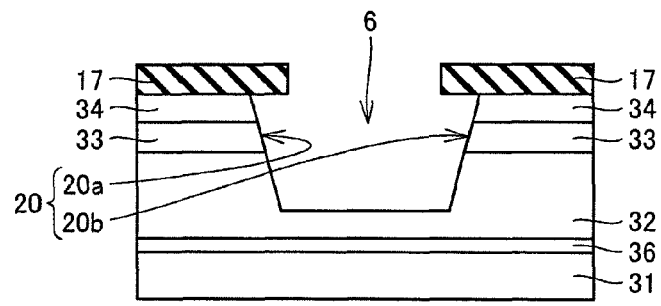
FIG. 22 is a schematic cross sectional view for illustrating the method for manufacturing the semiconductor device shown in FIG. 18.

Next, a thermal etching step is performed to exhibit a predetermined crystal plane in each of n type epitaxial layer 32, p type semiconductor layer 33, and n type source contact layer 34. Conditions for this thermal etching step can be substantially the same as the conditions for the thermal etching step described with reference to FIG. 9. As a result, trench 6 can be formed which has side walls 20 inclined relative to the main surface of substrate 31 as shown in FIG. 22. In this way, a structure shown in FIG. 22 is obtained.

Figure 23:
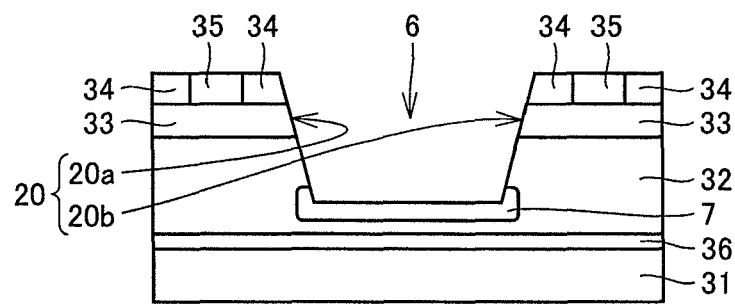
FIG. 23 is a schematic cross sectional view for illustrating the method for manufacturing the semiconductor device shown in FIG. 18.

Next, each of mask layers 17 is removed by means of an appropriate method such as etching. Thereafter, as with the step shown in FIG. 10, a resist film (not shown) having a predetermined pattern is formed using the photolithography method to extend from the inside of trench 6 onto the upper surface of n type source contact layer 34. As the resist film, there can be used a resist film having an opening pattern in conformity with the bottom portion of trench 6 and a portion of the upper surface of n type source contact layer 34. By implanting ions of an impurity of p type conductivity using this resist film as a mask, an electric field relaxing region 7 is formed at the bottom portion of trench 6 and contact region 35 of p type conductivity is formed at the region of the portion of n type source contact layer 34. Thereafter, the resist film is removed. As a result, a structure shown in FIG. 23 is obtained.

Then, an activation annealing step is performed to activate the impurity implanted by means of the above-described ion implantation. In this activation annealing step, as with the case of the above-described first embodiment of the present invention, the annealing treatment is performed without forming a particular cap layer on the surface of the epitaxial layer made of silicon carbide (specifically, on side wall 20 of trench 6). It should be noted that the above-described cap layer may be formed before performing the activation annealing step. Alternatively, for example, the cap layer may be provided only on the upper surfaces of n type source contact layer 34 and p type contact region 35 before performing the activation annealing treatment.

Figure 24:
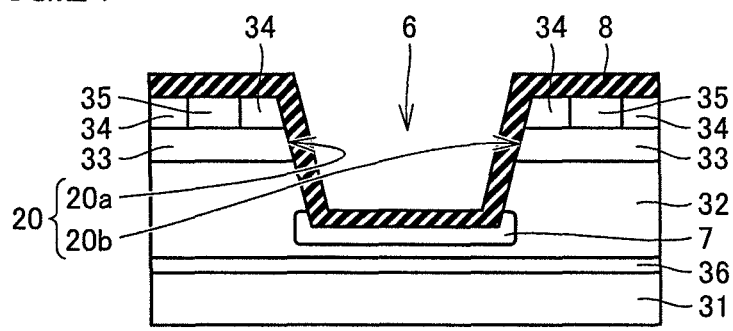
FIG. 24 is a schematic cross sectional view for illustrating the method for manufacturing the semiconductor device shown in FIG. 18.

Next, as shown in FIG. 24, gate insulating film 8 is formed to extend from the inside of trench 6 onto the upper surfaces of n type source contact layer 4 and p type contact region 5. Gate insulating film 8 is made of the same material as that of gate insulating film 8 shown in FIG. 12 and is formed by means of the same method as the method for forming gate insulating film 8 shown in FIG. 12. In this way, a structure shown in FIG. 24 is obtained.

Figure 25:
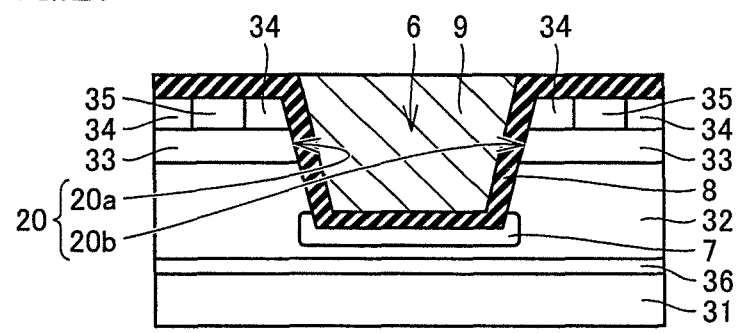
FIG. 25 is a schematic cross sectional view for illustrating the method for manufacturing the semiconductor device shown in FIG. 18.

Next, as shown in FIG. 25, gate electrode 9 is formed on gate insulating film 8 so as to fill the inside of trench 6. Gate electrode 9 can be formed by means of the same method as the method of forming gate electrode 9 shown in FIG. 13.

Next, interlayer insulating film 10 (see FIG. 26) is formed to cover the upper surface of gate electrode 9 and the upper surface of gate insulating film 8 exposed on p type contact region 35. Interlayer insulating film 10 can be made of any material as long as the material is insulative. Further, as with the step shown in FIG. 14, openings 11 (see FIG. 26) are formed in interlayer insulating film 10 and gate insulating film 8. Each of openings 11 is formed using the same method as the method of forming the opening in FIG. 14. Opening 11 has a bottom portion at which p type contact region 35 and a portion of n type source contact layer 34 are exposed.

Thereafter, using the same method as the method illustrated in FIG. 14, source electrode 12 is formed by a conductor film filling the inside of opening 11. This source electrode 12 is an ohmic electrode making ohmic contact with p type contact region 35 and n type source contact layer 34.

Figure 26:
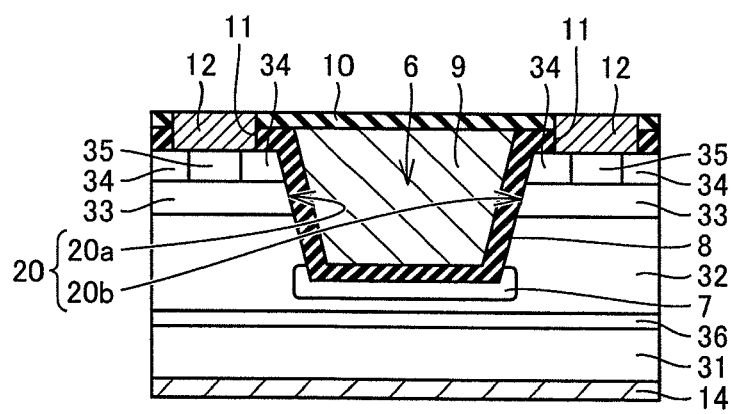
FIG. 26 is a schematic cross sectional view for illustrating the method for manufacturing the semiconductor device shown in FIG. 18.

Further, drain electrode 14 (see FIG. 26) is formed on the backside surface of substrate 31 (the surface thereof opposite to the main surface thereof on which n type epitaxial layer 32 is formed). Drain electrode 14 can be made of any material as long as the material allows for ohmic contact with substrate 31. In this way, a structure shown in FIG. 26 is obtained.

Thereafter, an appropriate method such as the sputtering method is employed to form source wire electrode 13 (see FIG. 18) and backside surface protecting electrode 15 (see FIG. 18). Source wire electrode 13 makes contact with the upper surface of source electrode 12, and extends on the upper surface of interlayer insulating film 10. Backside surface protecting electrode 15 is formed on the surface of drain electrode 14. As a result, the semiconductor device shown in FIG. 18 can be obtained.

Figure 27:
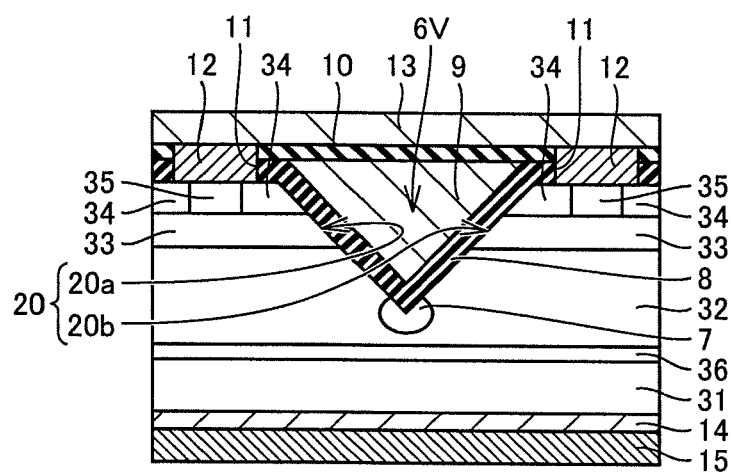
FIG. 27 is a schematic cross sectional view showing a variation of the semiconductor device shown in FIG. 18.

Next, referring to FIG. 27, a variation of the semiconductor device shown in FIG. 18 will be described. A semiconductor device shown in FIG. 27 basically has the same configuration as that of the semiconductor device shown in FIG. 18, but is different therefrom in terms of the shape of trench 6. Specifically, in the semiconductor device shown in FIG. 27, trench 6 has a V-shaped cross sectional shape as with that of the semiconductor device shown in FIG. 17. At the bottom portion of trench 6 (the portion at which the lower portions of the opposite side walls are connected to each other), an electric field relaxing region 7 is formed. With the semiconductor device thus configured, there can be provided the same effect as that of the semiconductor device shown in FIG. 18. Further, in the semiconductor device shown in FIG. 27, trench 6 does not have the flat bottom surface shown in FIG. 18. Accordingly, trench 6 shown in FIG. 27 has a width narrower than that of trench 6 shown in FIG. 18. As a result, the semiconductor device shown in FIG. 27 can be reduced in size as compared with the semiconductor device shown in FIG. 18.

This is advantageous in attaining finer design and higher integration in the semiconductor device.

Figure 28:
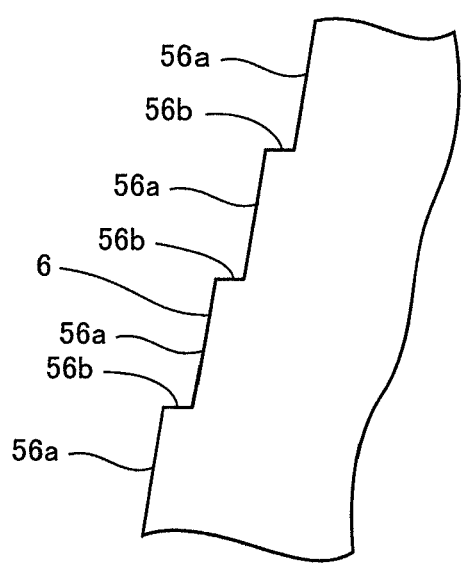
FIG. 28 is an enlarged schematic cross sectional view of a portion of a side surface of the silicon carbide layer.

In the present specification, the case where the side surface of trench 6 includes the {0-33-8} plane encompasses a case where the crystal plane constituting the side surface of trench 6 is the {0-33-8} plane. Further, in the present invention, the {0-33-8} plane also includes a chemically stable plane constituted by, for example, alternately providing a plane 56a (first plane) and a plane 56b (second plane) in the side surface of trench 6 as shown in FIG. 28, microscopically. Plane 56a has a plane orientation of {0-33-8} whereas plane 56b, which is connected to plane 56a, has a plane orientation different from that of plane 56a. Here, the term "microscopically" refers to "minutely to such an extent that at least the size about twice as large as an interatomic spacing is considered". Preferably, plane 56b has a plane orientation of {0-11-1}. Further, plane 56b in FIG. 28 may have a length (width) twice as large as, for example, the interatomic spacing of Si atoms (or C atoms).

Further, the invention of the present application is not limited to the above-described first and second embodiments. The silicon carbide layer may include a plurality of mesa structures at its main surface opposite to its surface facing substrate 1, 31 as shown in FIG. 1, FIG. 11, or the like, each of the mesa structures having a side surface constituted by side wall 20 described above. The silicon carbide layer may have a surface portion located between the plurality of mesa structures (the bottom portion of trench 6 located between the side surfaces of the plurality of mesa structures), continuous to side wall 20, and substantially corresponding to the {000-1} plane. Further, each of the mesa structures may have an upper surface continuous to side wall 20 and substantially corresponding to the {000-1} plane. Here, the expression "the surface portion or the upper surface substantially corresponds to the {000-1} plane" is intended to indicate that the crystal plane constituting the surface portion or the upper surface is a {000-1} plane and the crystal plane constituting the surface portion or the upper surface is a plane having an off angle of not less than −3° and not more than 3° relative to the {000-1} plane in the <1-100> direction. In this case, the above-described surface portion between the mesa structures (and/or the upper surface of each of the mesa structures) corresponds to the stable {000-1} plane (so-called "just plane"). Hence, even though no cap layer is formed to protect the surface portion (and the upper surface of each of the mesa structures), the surface portion and the upper surface of each of the mesa structures hardly become rough due to heat treatment such as the above-described activation annealing. Thus, the step of forming the cap layer on the surface portion and the upper surface of each of the mesa structures for the heat treatment such as activation annealing can be omitted.

The upper surface of each of the mesa structures continuous to side wall 20 may have a hexagonal planar shape as shown in FIG. 1 or FIG. 11. The plurality of mesa structures may include at least three mesa structures. The plurality of mesa structures may be arranged such that an equilateral triangle is formed by line segments connecting the respective centers thereof when viewed in a plan view as shown in FIG. 1. In this case, the mesa structures can be arranged most densely, thereby forming a larger number of mesa structures in one substrate 1, 31. Hence, semiconductor devices employing the mesa structures can be obtained from one substrate 1, 31 as many as possible.

Further, the semiconductor device may include a source electrode 12 formed on the upper surface of each of the mesa structures and a gate electrode 9 formed between the plurality of mesa structures as shown in FIG. 2 or FIG. 18. In this case, the locations of source electrode 12 and gate electrode 9 are such that they are formed relatively readily. Hence, the process of manufacturing the semiconductor device can be restrained from being complicated.

Further, the semiconductor device may further include an electric field relaxing region 7 formed between the plurality of mesa structures. In this case, when drain electrode 14 is formed on the backside surface of substrate 1, 31 (backside surface of substrate 1, 31 opposite to its main surface on which silicon carbide is formed), the existence of electric field relaxing region 7 allows for higher breakdown voltage between drain electrode 14 and an electrode located between the mesa structures (for example, gate electrode 9).

In the step of forming side wall 20, the silicon carbide layer may be provided with a plurality of mesa structures at its main surface opposite to its surface facing substrate 1, 31, each of the mesa structures having a side surface constituted by end surface (side wall 20). In this case, because side wall 20 of the mesa structure substantially includes the {0-33-8} plane, there can be readily formed a MOSFET or an IGBT, each of which utilizes side wall 20 for a channel region. It should be noted that the method for manufacturing the semiconductor device may further include the step of forming a source electrode 12 on the upper surface of each of the mesa structures as shown in FIG. 14 or FIG. 26.

In the step of forming side wall 20, the mesa structures each having an upper surface having a hexagonal planar shape may be formed as shown in FIG. 11. In this case, side wall 20 of the mesa structure can be substantially constituted only by the {0-33-8} plane. Thus, the entire side wall 20 of the outer circumference of the mesa structure can be used as the channel region, thereby achieving improved degree of integration of semiconductor devices.

The step of forming side surface 20 may include the steps of: forming a mask layer 17 as shown in FIG. 8 or FIG. 21; and forming the mesa structures as shown in FIG. 8 and FIG. 9 or FIG. 21 and FIG. 22. In the step of forming mask layer 17, a plurality of mask layers 17 each having a hexagonal planar shape may be formed on the main surface of the silicon carbide layer. In the step of forming the mesa structures, the mesa structures each having its upper surface having a hexagonal planar shape may be formed using mask layers 17 as a mask. In this case, the location of each of the mesa structures to be formed (i.e., the location of side wall 20) can be controlled in accordance with a location of the pattern of mask layers 17. This leads to increased degree of freedom in layout of the semiconductor device to be formed.

Further, as shown in FIG. 8 and FIG. 9 or FIG. 21 and FIG. 22, the step of forming side wall 20 may include the steps of: forming a mask layer 17; forming a recess (trench 16 of FIG. 8 or FIG. 21); and forming the mesa structures shown in FIG. 9 or FIG. 22. In the step of forming mask layer 17, a plurality of mask layers 17 each having a hexagonal planar shape may be formed with a space interposed therebetween on the main surface of the silicon carbide layer. In the step of forming the recess (trench 16), a portion of the silicon carbide layer exposed between the plurality of mask layers 17 may be removed using mask layers 17 as a mask, thereby forming the recess (trench 16) in the main surface of the silicon carbide layer. In the step of forming the mesa structures, a portion of the side wall of trench 16 may be removed, thereby forming the mesa structures each having an upper surface having a hexagonal planar shape. In this case, it takes a shorter time to remove (for example, thermally etch) a portion of the side wall of trench 16 to form the mesa structures, than that in the case where trench 16 is not formed in advance in the silicon carbide layer using mask layers 17 as a mask.

In the step of forming the end surface, side wall 20 of the mesa structure may be formed in a spontaneous formation manner. Specifically, by etching the silicon carbide layer under predetermined conditions (for example, thermal etching employing a mixed gas of oxygen and chlorine as a reactive gas and employing a heating temperature of not less than 700° C. and not more than 1200° C.), the {0-33-8} plane, which is a plane allowing for the slowest etching rate during etching, may be exhibited in a spontaneous formation manner. Alternatively, the surface to serve as side wall 20 may be formed through normal etching as shown in FIG. 15, and then a silicon film (Si film 21) may be formed on the surface. Then, the silicon carbide layer with Si film 21 is heated to form a SiC reconstitution layer 22 on the surface, thereby forming the above-described {0-33-8} plane accordingly. In this case, the {0-33-8} plane can be stably formed at the side wall 20.

In the step of forming side wall 20, side wall 20 of each of the mesa structures and the surface portion (bottom wall of trench 6) of the silicon carbide layer, which is located between the plurality of mesa structures and is continuous to side wall 20, may be formed in a spontaneous formation manner. Specifically, using techniques such as the thermal etching and formation of SiC reconstitution layer 22, the {0-33-8} plane may be exhibited at side wall 20 in each of the mesa structures, and a predetermined crystal plane (for example, a (0001) plane or a (000-1) plane) may be exhibited at the bottom wall of trench 6. In this case, the predetermined crystal plane (the {0-33-8} plane) can be formed stably at the bottom wall of trench 6 as with each of side walls 20.

In the semiconductor device, side wall 20 may include an active region as shown in FIG. 2 or FIG. 18. Further, in the semiconductor device, specifically, the active region includes a channel region. In this case, the above-described characteristics such as the reduced leakage current and the high breakdown voltage can be securely obtained.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device comprising:
    a substrate that is made of silicon carbide having a single-crystal structure of one of hexagonal system and cubic system and that is provided with a main surface having an off angle of 0.5° to 5° relative to a reference plane, said reference plane being a {000-1} plane in the case of the hexagonal system and being a {111} plane in the case of the cubic system; and
    a silicon carbide layer epitaxially formed on said main surface of said substrate, said silicon carbide layer being provided with a trench having first and second side walls opposite to each other, each of said first and second side walls including a channel region, each of said first and second side walls substantially including one of a {0-33-8} plane and a {01-1-4} plane in the case of the hexagonal system and substantially including a {100} plane in the case of the cubic system,
    wherein an inclination of said first and second side walls with respect to said main surface is controlled by said off angle from said reference plane, and
    wherein said substrate has a single-crystal structure of hexagonal system, and surfaces of said first and second side walls comprise a first plane and a second plane, said first plane having substantially a plane orientation of {0-33-8} and said second plane, which is connected to said first plane, having a plane orientation different from that of said first plane are alternately provided.

2. The silicon carbide semiconductor device according to claim 1, wherein a difference between inclination of said first side wall relative to said main surface and inclination of said second side wall relative to said main surface is 10° or smaller.

3. The silicon carbide semiconductor device according to claim 1, wherein said second plane has substantially a plane orientation of {0-11-1}.

4. A method for manufacturing a silicon carbide semiconductor device comprising the steps of:
    preparing a substrate that is made of silicon carbide having a single-crystal structure of one of hexagonal system and cubic system and that is provided with a main surface having an off angle of 5° or smaller relative to a reference plane, said reference plane being a {000-1} plane in the case of the hexagonal system and being a {111} plane in the case of the cubic system;
    epitaxially forming a silicon carbide layer on said main surface of said substrate; and
    forming a trench in said silicon carbide layer, said trench having first and second side walls opposite to each other,
    the step of forming said trench including the steps of
        providing a mask layer having a pattern, on said silicon carbide layer,
        partially etching said silicon carbide layer using said mask layer as a mask,
        removing said mask layer after said etching,
        forming a silicon layer on a surface of said trench, and
        forming a reconstitution layer of silicon carbide by heating said silicon carbide layer while forming said silicon layer,
    the step of etching including a step of inclining said first and second side walls by heating said silicon carbide layer in a reactive gas containing oxygen and chlorine, each of said first and second side walls substantially including one of a {0-33-8} plane and a {01-1-4} plane in the case of the hexagonal system and substantially including a {100} plane in the case of the cubic system,
    wherein an inclination of said first and second side walls with respect to said main surface is controlled by said off angle from said reference plane.

5. The method for manufacturing the silicon carbide semiconductor device according to claim 4, wherein the step of etching includes the step of supplying said reactive gas to said silicon carbide layer under a condition that a ratio of a flow rate of the oxygen to a flow rate of the chlorine is not less than 0.1 and not more than 2.0.

6. The method for manufacturing the silicon carbide semiconductor device according to claim 4, wherein the step of etching includes the step of setting a temperature of said silicon carbide layer at not less than 700° C. and not more than 1200° C.

7. The method for manufacturing the silicon carbide semiconductor device according to claim 4, the step of forming said trench further including the steps of:
    removing said reconstitution layer, and
    removing said silicon layer after removing said reconstitution layer.

8. A silicon carbide semiconductor device comprising:
    a substrate that is made of silicon carbide having a single-crystal structure of one of hexagonal system and cubic system and that is provided with a main surface having an off angle of 0.5° to 5° relative to a reference plane, said reference plane being a {000-1} plane in the case of the hexagonal system and being a {111} plane in the case of the cubic system; and a silicon carbide layer epitaxially formed on said main surface of said substrate, said silicon carbide layer being provided with a trench having first and second side walls opposite to each other, each of said first and second side walls including a channel region, each of said first and second side walls substantially including one of a {0-33-8} plane and a {01-1-4} plane in the case of the hexagonal system and substantially including a {100} plane in the case of the cubic system, wherein an inclination of said first and second side walls with respect to said main surface is controlled by said off angle from said reference plane, and wherein inclinations of said first and second side walls with respect to said main surface are different by an angle corresponding to twice as large as said off angle from said reference plane.

9. The silicon carbide semiconductor device according to claim 8, wherein a difference between the inclination of said first side wall relative to said main surface and the inclination of said second side wall relative to said main surface is 10° or smaller.

10. A silicon carbide semiconductor device comprising:

a silicon carbide substrate including a main surface having an off angle of 5° or smaller relative to a reference plane;

a silicon carbide layer on said main surface of said silicon carbide substrate;

first and second mesa structures formed on said silicon carbide layer with a space interposed therebetween, each of said first and second mesa structures including an upper surface having a hexagonal shape and six side walls; and a gate electrode formed between said first and second mesa structures with a gate insulation layer interposed therebetween, said reference plane being a (000-1} plane in the case of the hexagonal system and being a {111} plane in the case of the cubic system, said first mesa structure having a first side wall and said second mesa structure having a second side wall arranged next to said first side wall, each of said first and second side walls substantially including one of a {0-33-8} plane and a {01-1-4} plane in the case of the hexagonal system and substantially including a {100} plane in the case of the cubic system, an inclination of said first and the second side walls with respect to said main surface being controlled by said off angle from said reference plane.

* * * * *